(12) United States Patent
Ellä et al.

(10) Patent No.: US 10,530,415 B2
(45) Date of Patent: Jan. 7, 2020

(54) HF CIRCUIT AND FRONT-END CIRCUIT COMPRISING AN HF CIRCUIT

(71) Applicant: EPCOS AG, München (DE)

(72) Inventors: Juha Ellä, Halikko (FI); Edgar Schmidhammer, Stein an der Traun (DE); Gabriele Kolb, München (DE); Ratko Jovovic, München (DE)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 15/564,675

(22) PCT Filed: Apr. 21, 2016

(86) PCT No.: PCT/EP2016/058917
§ 371 (c)(1),
(2) Date: Oct. 5, 2017

(87) PCT Pub. No.: WO2016/180613
PCT Pub. Date: Nov. 17, 2016

(65) Prior Publication Data
US 2018/0076846 A1 Mar. 15, 2018

(30) Foreign Application Priority Data
May 11, 2015 (DE) .................. 10 2015 107 305

(51) Int. Cl.
| | | |
|---|---|---|
| *H04B 1/52* | (2015.01) |
| *H04B 1/00* | (2006.01) |
| *H04B 1/04* | (2006.01) |
| *H04B 1/10* | (2006.01) |
| *H04B 1/18* | (2006.01) |

(Continued)

(52) U.S. Cl.
CPC ............ *H04B 1/52* (2013.01); *H01P 1/15* (2013.01); *H01P 1/18* (2013.01); *H01P 1/20* (2013.01); *H03H 7/0123* (2013.01); *H03H 7/0161* (2013.01); *H03H 7/463* (2013.01); *H04B 1/0057* (2013.01); *H04B 1/0458* (2013.01); *H04B 1/109* (2013.01); *H04B 1/18* (2013.01); *H04B 1/406* (2013.01); *H04B 1/48* (2013.01)

(58) Field of Classification Search
CPC ... H04B 1/52; H04B 1/18; H04B 1/48; H04B 1/406; H04B 1/0057; H04B 1/0458; H03H 7/463; H03H 7/0123; H01P 1/20; H01P 1/18; H01P 1/15
USPC ........................................ 455/83
See application file for complete search history.

(56) References Cited

U.S. PATENT DOCUMENTS

2004/0248539 A1 12/2004 Furutani et al.
2005/0206478 A1 9/2005 Satoh et al.
(Continued)

FOREIGN PATENT DOCUMENTS

CN 1795617 A 6/2006
CN 101442838 A 5/2009

OTHER PUBLICATIONS

International Search Report and Written Opinion—PCT/EP2016/058917—ISA/EPO—dated Jun. 29, 2016.

*Primary Examiner* — Eugene Yun
(74) *Attorney, Agent, or Firm* — Patterson & Sheridan, L.L.P.

(57) ABSTRACT

The invention relates to an HF circuit, for example for use in front-end circuits, having improved signal quality in carrier aggregation. According to the invention, a signal path between a duplexer and a diplexer comprises a phase shifter.

12 Claims, 6 Drawing Sheets

(51) Int. Cl.
*H01P 1/15* (2006.01)
*H01P 1/18* (2006.01)
*H01P 1/20* (2006.01)
*H03H 7/01* (2006.01)
*H03H 7/46* (2006.01)
*H04B 1/403* (2015.01)
*H04B 1/48* (2006.01)

(56) References Cited

U.S. PATENT DOCUMENTS

2015/0318827 A1* 11/2015 Srinidhi Embar ........ H03F 3/21
    330/295
2017/0187099 A1* 6/2017 Patel ...................... H01Q 1/246

* cited by examiner

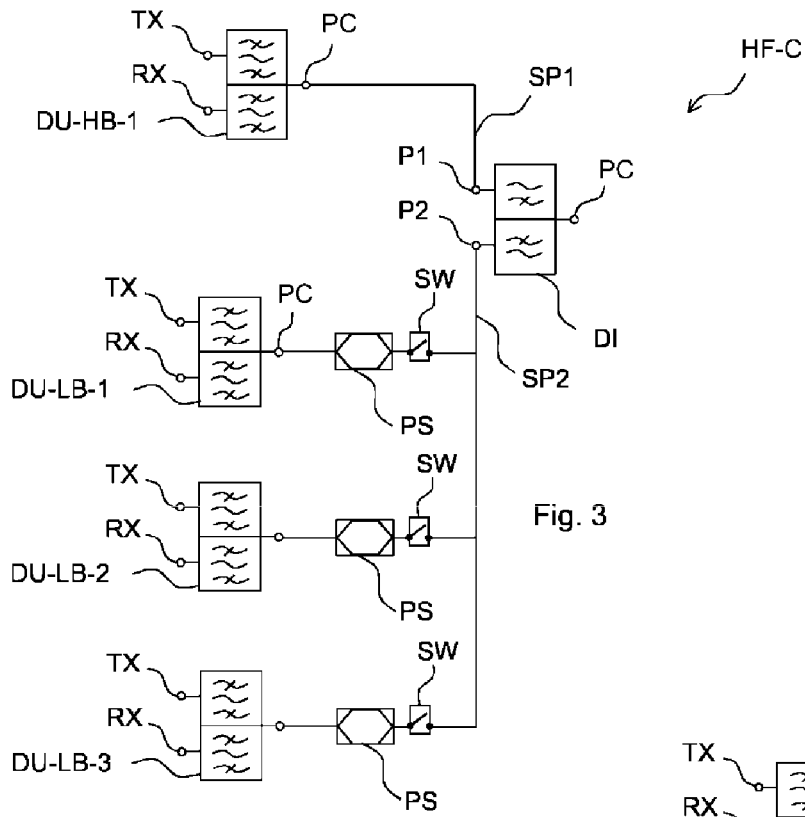
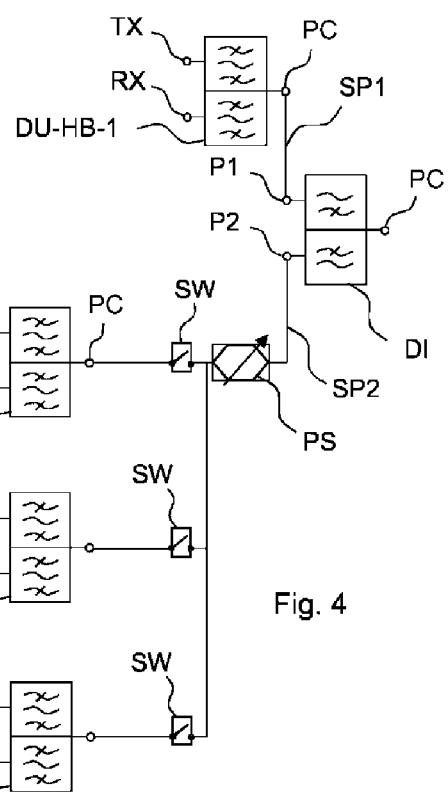
Fig. 3
Fig. 4

HF CIRCUIT AND FRONT-END CIRCUIT COMPRISING AN HF CIRCUIT

CROSS-REFERENCE TO RELATED APPLICATIONS

This application is a national stage application under 35 U.S.C. 371 of PCT/EP2016/058917, filed Apr. 21, 2016, which claims the benefit of German Patent Application Serial No. 102015107305.6, filed on May 11, 2015, both of which are incorporated herein by reference in their entirety.

The invention relates to HF circuits which can be used, for example, in front-end circuits of mobile radio devices.

Front-end circuits of mobile radio devices connect one or more receiving or transmitting amplifiers with one or more antennas. This connection is made by means of signal paths and HF filters, which are interconnected such that the requirements for the signal quality of the mobile radio devices are met and, at the same time, a plurality of transmission systems and transmission frequencies can be used.

From U.S. Pat. No. 7,212,789 B2, HF circuits with a tunable duplexer are known.

While, for of conventional FDD (frequency division duplexing) systems, transmission and reception frequencies are used simultaneously, different transmission frequencies can be used simultaneously or different reception frequencies can be used simultaneously (carrier aggregation) to increase the data transmission rate. In interband carrier aggregation systems, two FDD reception frequencies can be used simultaneously along with one FDD transmission frequency. It is also possible to use two FDD transmission frequencies simultaneously, together with one reception frequency or several reception frequencies (Tx carrier aggregation).

However, such common use of different frequency bands will present problems with conventional HF circuits since they are not adapted to the additional HF power, in particular with respect to the separation of different signal paths.

It is therefore an object to provide an HF circuit that allows good separation between different signal paths even if the circuit is subjected to HF signals of different frequency bands. In particular, the interference with a signal path due to intermodulation products should be reduced.

This object is achieved by the HF circuit according to claim 1. Dependent claims provide advantageous embodiments.

For this purpose, an HF circuit comprises a diplexer, a first duplexer for a first frequency band, and a first duplexer for a second frequency band. The diplexer has a first port, a common port, and a second port. The first duplexer for the first frequency band has a transmission port, a common port, and a reception port. The first duplexer for the second frequency band also has a transmission port, a common port, and a reception port. The circuit further comprises a first signal path between the common port of the first duplexer of the first frequency band and the first port of the diplexer. The HF circuit further comprises a second signal path between the common port of the first duplexer, the second frequency band, and the second port of the diplexer. Furthermore, the circuit comprises a phase shifter which is arranged in the second signal path. The phase shifter is provided to adapt the impedances of the first duplexer of the second frequency band and the diplexer for at least one harmonic of one of the frequency bands such that at least one intermodulation product is reduced.

The impedance adaptation relates in particular to the impedance of the common port of the first duplexer of the second signal path and of the second port of the diplexer.

The harmonic in this case can be in particular the second or third harmonic of transmission frequencies, e.g., of the first frequency band.

The improved signal separation of such an HF circuit is thus due to the reduction of the intermodulation products. It has been found that, in conventional HF circuits of front-end circuits, the isolation of a diplexer that is used can be so poor that HF signals that are undesirably occurring in a signal path can cause intermodulation products due to nonlinear effects in a duplexer downstream of the diplexer. Their frequencies are within in the transmission range of the duplexer. Such undesired HF signals can then not be eliminated further by conventional HF filters since their frequencies are the same as the frequencies of desired signals.

By means of the phase shifter, the formation of these intermodulation products is effectively prevented, or at least reduced enough, so that the undesirable, but significantly weaker, intermodulation products no longer interfere.

This HF circuit is compatible with conventional switching topologies of front-end circuits, with the comparatively high gain in signal quality being achieved by a comparatively low additional circuit complexity.

The diplexer may be a ceramic diplexer.

Such a ceramic diplexer may comprise a base body made of an insulating material, e.g., ceramics. In the base body, recesses may be provided, the inner surfaces of which are covered by metallization. Such a diplexer typically already has very high linearity.

The first frequency band may be the 2-gigahertz band and the second frequency band may be the 1-gigahertz band.

The first frequency band then substantially comprises the frequencies between 1 GHz and 2 GHz, in particular between 1.4 and 2.2 GHz. The second frequency band then substantially comprises frequencies ≤1 GHz.

The first frequency band and the second frequency band may also be selected from the three frequency ranges: low band (LB, about 650 to 1000 MHz), mid band (MB, 1700 to 2200 MHz) and high band (HB, frequencies f substantially >2500 MHz.

In particular, the mobile radio frequency bands, 1, 2, 3, 4, 5, 7, 8, 12, 17, 19, 20, 21, 26, or 28, are suitable as a first frequency band or as a second frequency band, for example, for carrier aggregation at transmission frequencies. The mobile radio bands, 5, 8, 12, 17, 19, 20, 26 and 28, are associated with the LB. The mobile radio bands, 1, 2, 3, 4, 21, are associated with the MB and the frequency band 7 is associated with the HB.

For example, the following frequency band pairs may be used in combination:

LB and LB: 5 and 12, 5 and 17;

LB and MB: 3 and 5, 1 and 5, 3 and 20, 1 and 19, 3 and 8, 4 and 12, 4 and 17, 3 and 26, 3 and 19, 19 and 21;

MB and MB: 1 and 21, 2 and 4;

MB and HB: 1 and 7, 3 and 7, 4 and 7;

LB and HB: 7 and 20, 7 and 28, 5 and 7.

The HF circuit may further comprise a second or more additional duplexers of the first frequency band. The second duplexer or the plurality of additional duplexers of the first frequency band are here interconnectable parallel to the first duplexer of the first frequency band on one hand, and to the first signal path on the other hand. This allows for transmission operation via different duplexers of the first frequency band—whether simultaneously or successively.

The HF circuit may also have a switch arrangement, by means of which the first port of the diplexer is interconnectable with the second or more additional duplexers of the first frequency band. Using the switch arrangement, it is then possible to individually adjust which of the duplexers is to be interconnected with the diplexer. Exactly one duplexer may always be connected to the diplexer at any time. However, it is also possible that, at a certain time, no duplexer is interconnected with the diplexer or several duplexers are simultaneously interconnected with the diplexer.

Furthermore, the HF circuit may comprise a second or more additional duplexers of the second frequency band. The second or more duplexer of the second frequency band are interconnectable parallel to the first duplexer of the of the second frequency band on one hand, and to the second signal path on the other hand.

In this case, the HF circuit may also further comprise an additional switch arrangement, by means of which the second port of the diplexer is interconnectable with the second or more additional duplexers of the second frequency band.

Analogously to the situation of the first frequency band described above, the number of duplexers of the second frequency band that are interconnected with the diplexer can thus also be individually adjusted.

The phase shifter may be tunable. A tunable phase shifter may in particular be a phase shifter the characteristic frequencies and/or the phase offset of which are adjustable for relevant frequencies.

One phase shift may be provided in the second signal path for each duplexer of the second frequency band.

If the HF circuit comprises several phase shifters, they can be arbitrarily selected from the above-mentioned alternatives. However, several or all of the phase shifters may also be of the same type.

The phase shifter may reflect an undesired signal originating from the diplexer back to the diplexer. Desired signals in the corresponding frequency range may pass through the diplexer without substantial loss of power. The phase shifter may particularly be a tunable phase shifter in which the degree of the phase shift of a signal with a certain frequency is adjustable. For example, the phase offset caused by the phase shifter preferably varies linearly with the frequency of the applied signal.

A phase shifter configured as a phase shifter may in particular be an all-pass filter, consisting of inductances and capacities.

A stripline may also be used as a phase shifter.

In particular, the HF circuit may be interconnected in a mobile radio device, e.g., in a front-end circuit of the mobile radio device. A mobile radio device with a front-end circuit comprising such an HF circuit provides the user with an increased data rate along with unimpaired signal quality.

The number of duplexers for each first or second frequency band is not limited. Both the first and second frequency bands may independently have 1, 2, 3, 4, or more duplexers.

The first frequency band may have 1, 2, 3, 4, 5, or more duplexer. The second frequency band may also have 1, 2, 3, 4, 5, or more duplexer.

In the following, central principles of the HF circuit and some non-limiting exemplary embodiments will be explained in more detail by means of schematic figures.

Shown are:

FIG. 3 shows an embodiment with several duplexers of the second frequency band,

FIG. 4 shows an embodiment with a tunable phase shifter,

Figure 5:
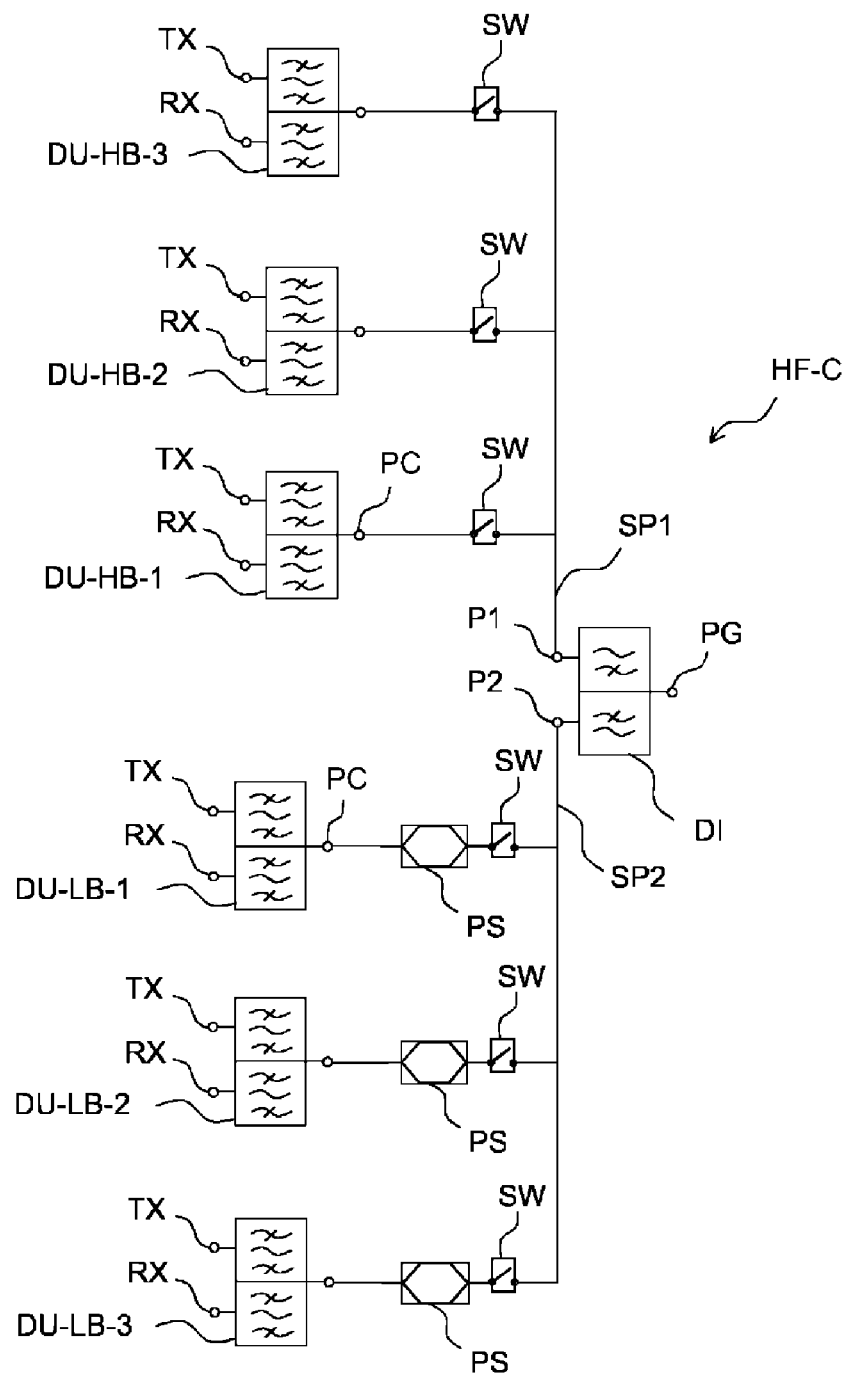
Figure 6:
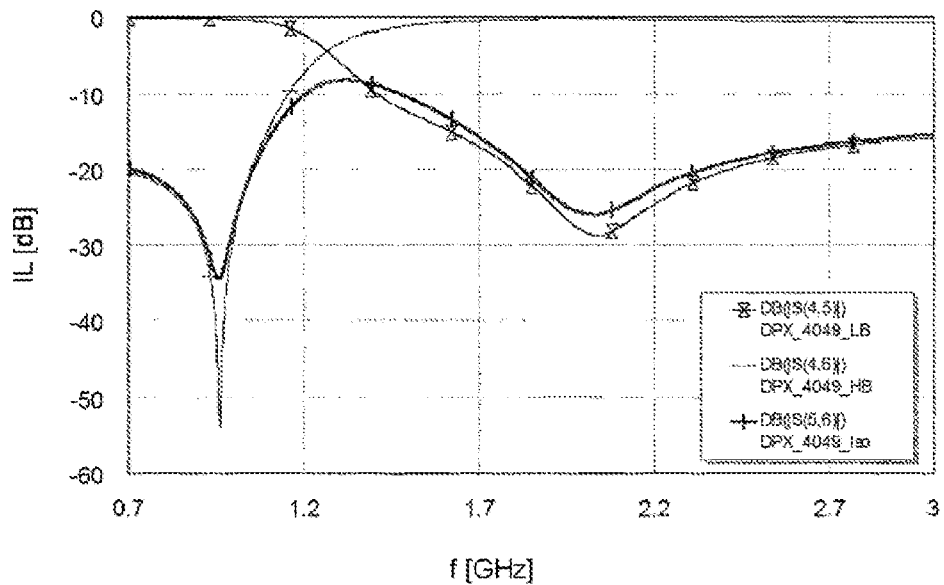
Figure 7:
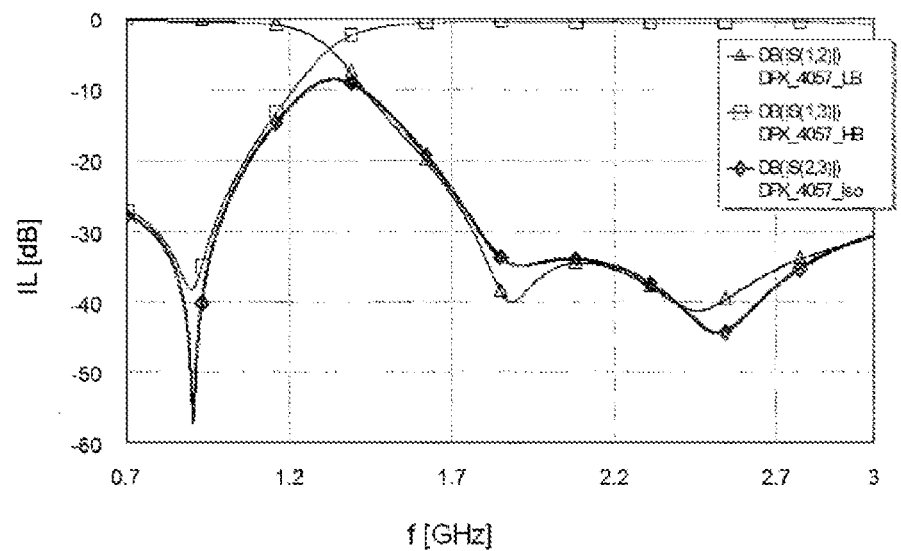
Figure 8:
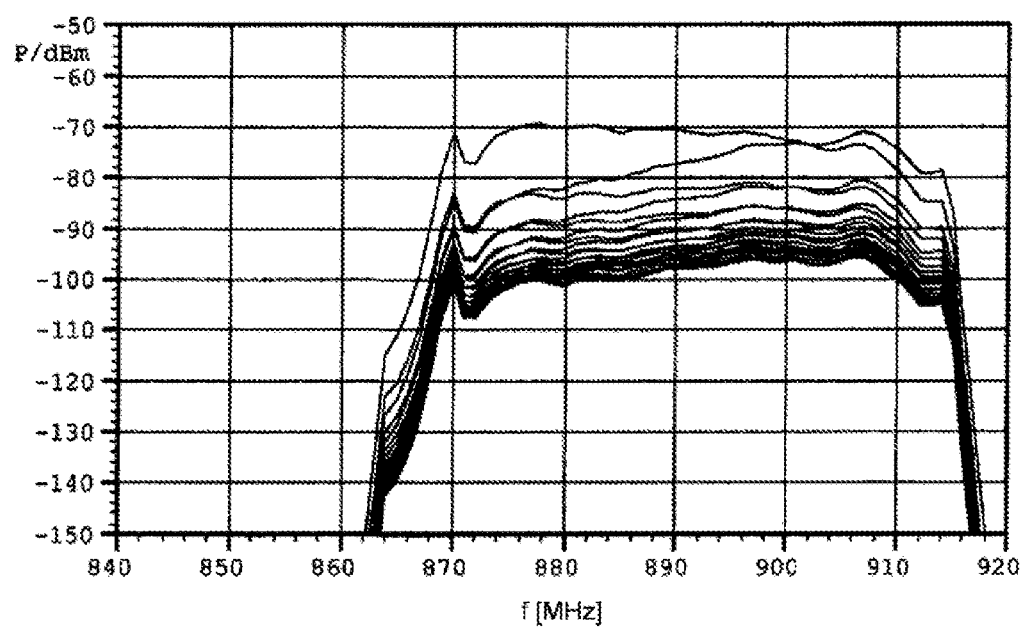
Figure 9:
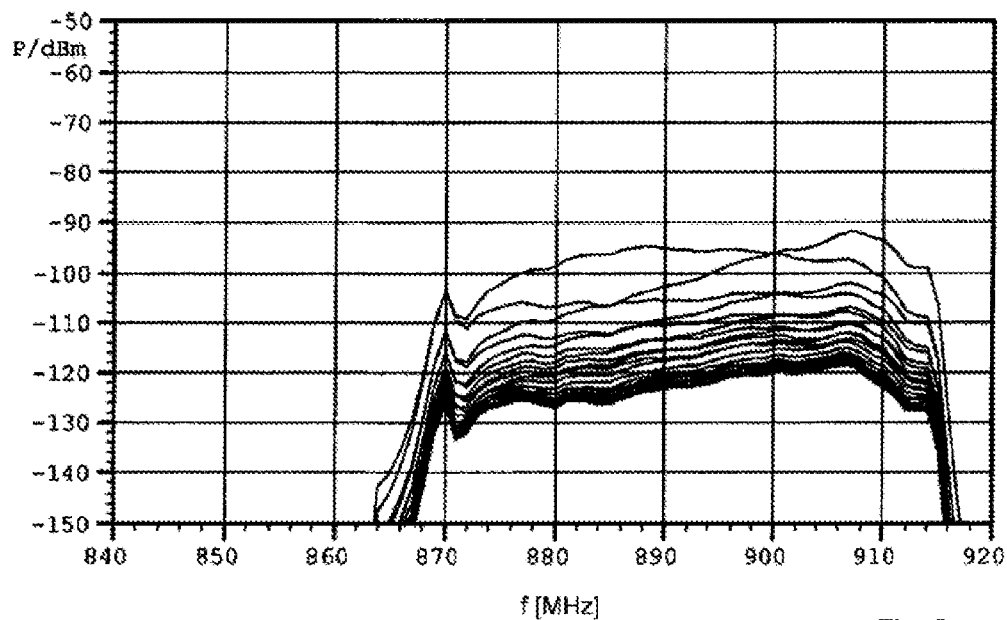
Figure 10:
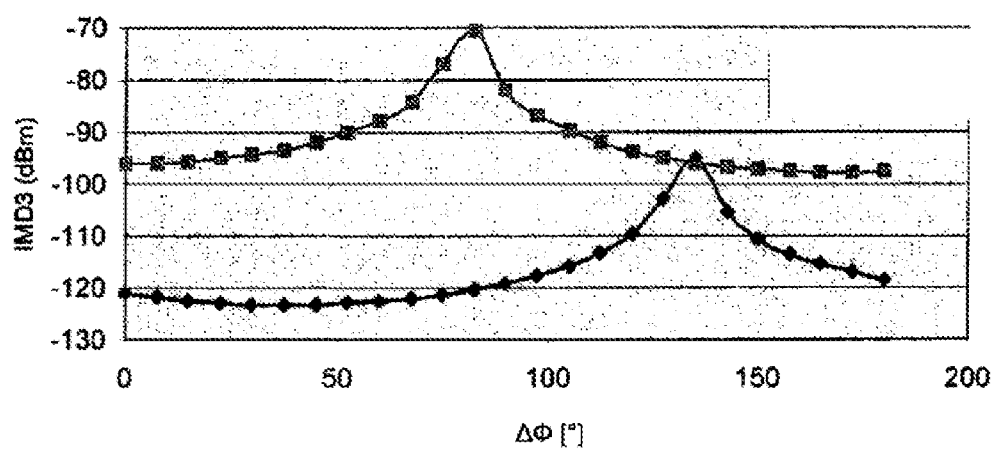

FIG. 5 shows an embodiment with several duplexers of the first frequency band and several duplexers of the second frequency band, FIG. 6 shows characteristic transmission curves of a typical diplexer, FIG. 7 shows characteristic transmission curves of a typical diplexer with somewhat improved isolation, FIG. 8 shows the effect of a phase shifter within an HF circuit on the basis of different curves, each representing a measure of an intermodulation product, for different values of the phase offset, FIG. 9 shows the effect of a phase shifter within an HF circuit with an improved diplexer on the basis of different curves, each representing a measure of an intermodulation product, for different values of the phase offset, FIG. 10 shows the dependence of the strength of intermodulation products on a phase rotation by the phase shifter at the center frequency.

Figure 1:
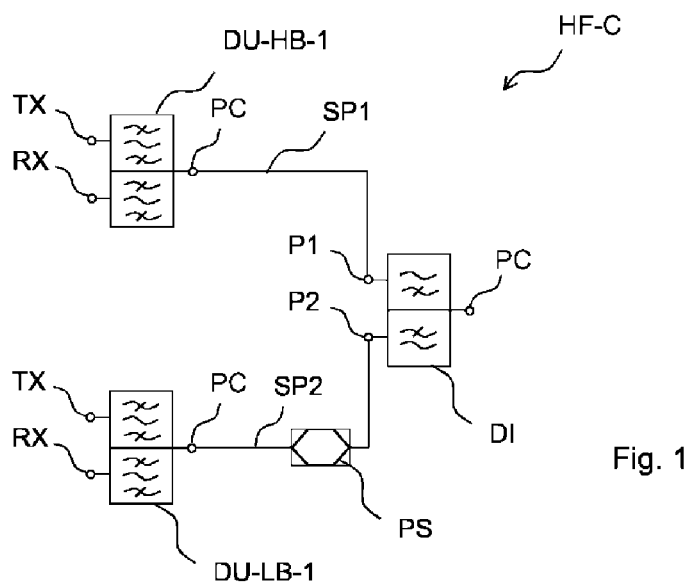
FIG. 1 shows the basic structure of an HF circuit.

FIG. 1 shows a simple embodiment of an HF circuit HF-S, having a first duplexer of a first frequency band DU-HB-1, a first duplexer of a second frequency band DU-LB-1, and a diplexer DI. The first duplexer of the second frequency band DU-LB-1 connects a second signal path SP2 to the second port P2 of the diplexer DI. A phase shifter PS is interconnected in the second signal path SP2. The common port PC of the first duplexer of the first frequency band DU-HB-1 connects a first signal path SP1 to the first port P1 of the diplexer DI. The common port PC of the diplexer DI is interconnectable with an antenna of a communication device. Each of the two duplexers has a transmission port TX and a reception port RX. The two duplexers may be interconnected with one or more transceiver circuits of a mobile radio device via the transmission and reception ports.

The following situation is critical when operating a conventional HF circuit: A transmission signal, is coupled in via both transmission ports TX of the two duplexers and reaches the diplexer DI via the signal paths SP1 and SP2. Due to the finite isolation of the diplexer DI, a part of the transmission signal from the first frequency band is coupled into the second signal path SP2 in the direction of the duplexer of the second frequency band. Typically, the duplexers themselves are circuits with imperfectly linear behavior, wherein different TX signals come together at the TX filter of the duplexer of the second frequency band DU-LB-1 in this case. Due to non-linear effects of the duplexer of the second frequency band, an intermodulation product is produced which could pass through the reception filter RX and may interfere with, or even completely prevent, the simultaneous reception of the communication device. If, for example, the communications device is to transmit simultaneously in bands 3 and 5, an intermodulation product may occur at 1710 MHz-824 MHz=886 MHz. This lies within the band 5 reception frequency band (RX) and can therefore pass through the reception filter almost undamped.

In the present HF circuit HF-S, a signal leaking from the diplexer DI into the second signal path 2 is shifted by the phase shifter in its phase position such that no mixing with the transmission signal for the second signal path SP2 can occur at the duplexer. As a result, the generation of the intermodulation product at 886 MHz is prevented or its intensity is weakened so that reception operation is easily possible.

Figure 2:
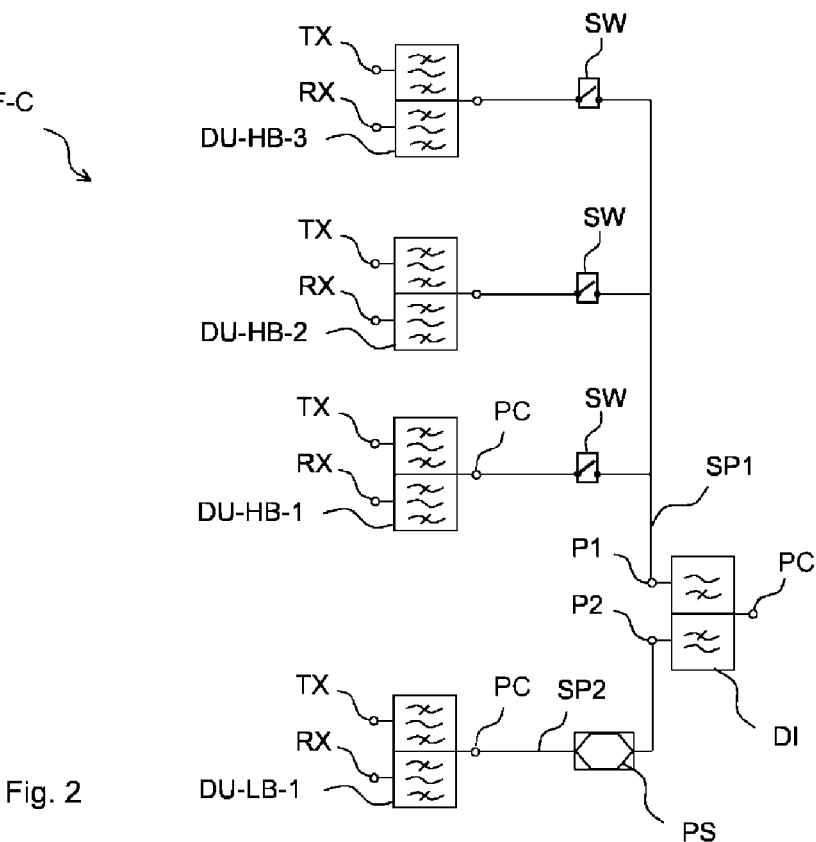
FIG. 2 shows an embodiment with several duplexers of the first frequency band.

FIG. 2 shows an embodiment in which three duplexers, DU-HB-1, DU-HB-2, DU-HB-3, are provided for the first frequency band. By means of an individual switch SW, each of the duplexers can be coupled into the first signal path SP1.

Essentially analogously, FIG. 3 shows an embodiment of an HF circuit HF-S, in which three duplexers, DU-LB-1, DU-LB-2, DU-LB-3, of the second frequency band are provided. By means of switches, each of the three duplexers can be individually coupled into the second signal path SP2. Each of the three duplexers may here have a phase shifter PS specifically assigned to it. The switches are preferably interconnected between the phase shifters and the diplexer.

FIG. 4 shows how a single phase shifter, rather than the three different phase shifters, may be interconnected in the second signal path SP2. This phase shifter PS is provided and suited for preventing or weakening intermodulation products for all three duplexers of the second frequency band.

FIG. 5 shows an embodiment in which three duplexers are provided in each of the first frequency band and the second frequency band.

FIG. 6 shows characteristic curves of a typical diplexer with relatively low isolation.

FIG. 7 shows characteristic curves of a typical diplexer with higher isolation.

FIG. 8 shows the intensity of the intermodulation interference in a carrier aggregation of the two Tx bands, B5 and B7, when the diplexer of FIG. 6 is used. The different curves each represent a different phase offset by the phase shifter. The intermodulation product has frequency components of about 880 MHz:

$$B7\text{-}Tx\ (2540\ \text{MHz}) - 2 \times B5\text{-}Tx\ (2 \times 830\ \text{MHz}) = B5\text{-}Rx\ (880\ \text{MHz}).$$

The HF circuit comprises, a tunable phase shifter as a phase shifter, the phase offset of which is adjustable. Depending on the phase offset selected, an intermodulation interference reduction of up to about 30 dB may be achieved.

Correspondingly, FIG. 9 shows different isolation values of an HF circuit including the "improved" diplexer of FIG. 7 with increased isolation—in addition to a tunable phase shifter as a phase shifter. The different curves shown in FIG. 8 represent the isolation values with a varied phase offset by the phase shifter. Analogous to FIG. 7, the reduction of intermodulation interferences can be improved by selecting a suitable phase offset by up to 30 dB.

Overall, FIGS. 6 to 9 show that HF circuits, both with poorer and improved diplexers, benefit considerably from the new circuit topology.

FIG. 10 shows the intensity of intermodulation products for HF circuits, each with one of the two diplexers shown in FIG. 6 and a phase shifter configured as a phase shifter. It is found that the improved isolation actually results in a reduction of the intermodulation products—but only if the phase shifter dimensioning is appropriately optimized or adjusted accordingly.

The HF circuit is not limited to the described or shown exemplary embodiments. An HF circuit may, in particular, include additional circuit components, signal paths, filters, switches.

LIST REFERENCE SIGNS

PB-HP: Pass band of the high-pass of the diplexer
PB-LP: Pass band of the low-pass of the diplexer
DI: Diplexer
DU: Duplexer
DU-HB-1: First duplexer of the first frequency band
DU-HB-2: Second duplexer of the first frequency band
DU-HB-3: Third duplexer of the first frequency band
DU-LB-1: First duplexer of the second frequency band
DU-LB-2: Second duplexer of the second frequency band
DU-LB-3: Third duplexer of the second frequency band
HF-C: HF circuit
IS: Isolation of the diplexer
PC: Common port
RX: Receiving port
PS: Phase shifter
SD: Switch
SP1: First signal path
SP2: Second signal path
TX: Transmission port

The invention claimed is:

1. A high frequency (HF) circuit, comprising:
   a diplexer, having a first port, a common port, and a second port;
   a first duplexer for a first frequency band, having a transmission port, a common port, and a reception port;
   a first duplexer for a second frequency band, having a transmission port, a common port, and a reception port;
   a first signal path between the common port of the first duplexer for the first frequency band and the first port of the diplexer;
   a second signal path between the common port of the first duplexer for the second frequency band and the second port of the diplexer; and
   a phase shifter in the second signal path, wherein having the phase shifter in the second signal path reduces at least one intermodulation product produced by the first duplexer for the second frequency band, the at least one intermodulation product resulting from a transmission signal on the first signal path leaking into the second signal path, the transmission signal being provided to the transmission port of the first duplexer for the first frequency band.

2. The HF circuit according to claim 1, wherein the diplexer is a ceramic diplexer.

3. The HF circuit according to claim 1, wherein the first frequency band is a 2 GHz band and the second frequency band is a 1 GHz band.

4. The HF circuit according to claim 1, wherein the first frequency band is a 2.5 GHz band and the second frequency band is a 1 GHz band.

5. The HF circuit according to claim 1, further comprising a second or a plurality of additional duplexers for the first frequency band that are interconnectable in parallel with the first duplexer for the first frequency band and with the first signal path.

6. The HF circuit according to claim 5, further comprising a switch arrangement by which the first port of the diplexer is interconnectable with one or a plurality of the second or the plurality of additional duplexers for the first frequency band.

7. The HF circuit according to claim 1, further comprising a second or a plurality of additional duplexers for the second frequency band that are interconnectable in parallel with the first duplexer for the second frequency band and with the second signal path.

8. The HF circuit according to claim 7, further comprising a switch arrangement by which the second port of the diplexer is interconnectable with one or a plurality of the second or the plurality of additional duplexers for the second frequency band.

9. The HF circuit according to claim 1, wherein the phase shifter is tunable in its phase offset.

10. The HF circuit according to any of the preceding claims, wherein one phase shifter per duplexer for the second frequency band is provided in the second signal path.

11. A mobile radio device, comprising a high frequency (HF) circuit comprising:
- a diplexer, having a first port, a common port, and a second port;
- a first duplexer for a first frequency band, having a transmission port, a common port, and a reception port;
- a first duplexer for a second frequency band, having a transmission port, a common port, and a reception port;
- a first signal path between the common port of the first duplexer for the first frequency band and the first port of the diplexer;
- a second signal path between the common port of the first duplexer of for the second frequency band and the second port of the diplexer; and
- a phase shifter in the second signal path, wherein having the phase shifter in the second signal path reduces at least one intermodulation product produced by the first duplexer for the second frequency band, the at least one intermodulation product resulting from a transmission signal on the first signal path leaking into the second signal path, the transmission signal being provided to the transmission port of the first duplexer for the first frequency band.

12. A method of wireless communication, comprising:
providing a first transmission signal to a transmission port of a first duplexer for a first frequency band, wherein the first duplexer for the first frequency band comprises the transmission port, a common port, and a reception port, a first signal path being between the common port of the first duplexer for the first frequency band and a first port of a diplexer having the first port, a common port, and a second port;

providing a second transmission signal to a transmission port of a first duplexer for a second frequency band, the first duplexer for the second frequency band having a transmission port, a common port, and a reception port, a second signal path being between the common port of the first duplexer for the second frequency band and the second port of the diplexer;

and reducing, by having a phase shifter in the second signal path, at least one intermodulation product produced by the first duplexer for the second frequency band, the at least one intermodulation product resulting from the first transmission signal on the first signal path leaking into the second signal path.

* * * * *